(12) United States Patent
Ding et al.

(10) Patent No.: US 9,599,657 B2
(45) Date of Patent: Mar. 21, 2017

(54) HIGH POWER RADIO FREQUENCY (RF) IN-LINE WAFER TESTING

(71) Applicant: INTERNATIONAL BUSINESS MACHINES CORPORATION, Armonk, NY (US)

(72) Inventors: Hanyi Ding, Colchester, VT (US); John Ferrario, Waterbury, VT (US); Barton E. Green, Milton, VT (US); Stephen Moss, Burlington, VT (US); Mustapha Slamani, South Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 1115 days.

(21) Appl. No.: 13/733,507

(22) Filed: Jan. 3, 2013

(65) Prior Publication Data

US 2014/0184258 A1    Jul. 3, 2014

(51) Int. Cl.
*G01R 31/20* (2006.01)
*G01R 31/26* (2014.01)
*G01R 1/067* (2006.01)

(52) U.S. Cl.
CPC ......... *G01R 31/26* (2013.01); *G01R 1/06766* (2013.01); *G01R 1/06772* (2013.01)

(58) Field of Classification Search
CPC . G01R 31/26; G01R 1/06766; G01R 1/06772
USPC .................................................. 324/754.03
See application file for complete search history.

(56) References Cited

U.S. PATENT DOCUMENTS

| 4,027,935 | A | 6/1977 | Byrnes et al. | |
|---|---|---|---|---|
| 5,977,787 | A | 11/1999 | Das et al. | |
| 6,194,739 | B1* | 2/2001 | Ivanov | H01L 22/34 257/48 |
| 6,300,785 | B1 | 10/2001 | Cook et al. | |
| 6,300,786 | B1 | 10/2001 | Doherty et al. | |
| 7,518,102 | B2 | 4/2009 | Petrillo et al. | |
| 7,733,102 | B2 | 6/2010 | Cheng | |
| 2003/0006413 | A1 | 1/2003 | Chawla et al. | |
| 2003/0173668 | A1* | 9/2003 | Downey | H01L 22/32 257/750 |
| 2006/0066328 | A1 | 3/2006 | Clegg et al. | |
| 2010/0164519 | A1 | 7/2010 | Sellathamby et al. | |

OTHER PUBLICATIONS

Whittaker, Probe Testing of Wafer Level Chip Scale Packaging, High Frequency Electronics, vol. 10 No. 10, pp. 52-58, Oct. 2001.*

(Continued)

*Primary Examiner* — Daniel Miller
(74) *Attorney, Agent, or Firm* — Michael LeStrange; Andrew M. Calderon; Roberts Mlotkowski Safran Cole & Calderon, P.C.

(57) ABSTRACT

Approaches for performing in line wafer testing are provided. An approach includes a method that includes generating a radio frequency (RF) test signal, and applying the RF test signal to a device under test (DUT) in a wafer using a buckling beam probe set with a predefined pitch. The method also includes detecting an output RF signal from the DUT in response to the applying the RF test signal to the DUT, and sensing at least one frequency component of the detected output RF signal.

18 Claims, 5 Drawing Sheets

(56) References Cited

OTHER PUBLICATIONS

Oerth et al., Evaluating pHEMT Process Improvements Using Wafer Level RF Tests, CS MANTECH Conference, pp. 277-280, 2010.*

Moskowitz, "Electrical Performance of High Density Probe Array for Testing Josephson Circuit Chips," IEEE Transactions on Magnetics, vol. 17, Issue 1, Jan. 1981, pp. 761-763.

Moore, "Advanced Probecard Architecture for Lower-Cost RF Wafer Testing," 2007 IEEE Semiconductor Wafer Test Workshop Oresentation, SWTW, Jun. 5, 2007, 24 pages.

Mann et al., "The Leading Edge of Production Wafer Probe Test Technology," IEEE International Test Conference, ITC, Oct. 26-28, 2004, pp. 1168-1193.

"Epoxy Ring Probe Cards", http://www.jem-europe.com/epoxy_ring_probe_cards.htm, 2003, 1 page.

\* cited by examiner

HIGH POWER RADIO FREQUENCY (RF) IN-LINE WAFER TESTING

FIELD OF THE INVENTION

The present invention relates to integrated circuit devices and, more particularly, to in-line testing of integrated circuit devices at wafer level using wafer probing.

BACKGROUND

Wafer in-line/kerf testing is a common step in wafer process yield monitoring. Wafer testing is the process of testing integrated circuits at the wafer level while the individual chips (i.e., die) are contained in a wafer, e.g., prior to dicing and packaging the individual chips. In-line testing, also referred to as in-process testing, is performed between fabrication steps at the wafer level using test equipment including wafer probes. The probes are used to establish contact with locations on the wafer for providing electric power to circuits contained in the chips for testing the chips, e.g., for defects. The locations on the wafer where the probes contact the wafer can be within the individual die, or may be in the kerf lines (i.e., interstitial areas) between the die.

Current in-line/kerf testing uses cantilever-type probe sets, which provide fine-pitch probing and work well for direct current (DC) and analog signals. Cantilever-type probe sets typically operate at low power and have long lead lengths that are not suited to radio frequency (RF) signals.

Manual probing, in contrast to in-line testing, is where a wafer is taken out of the process line and manually tested. Manual RF probe sets, e.g., including some ground-signal-ground (GSG) probe sets, may be used for some RF tests. However, such manual probing is time and labor intensive compared to in-line testing, and normally is confined to testing at the last metal layer of the wafer (e.g., the last wiring level of the wafer) in order to avoid damaging the dielectric layers when being used for thin metal probing.

Accordingly, there exists a need in the art to overcome the deficiencies and limitations described hereinabove.

SUMMARY

In a first aspect of the invention, there is a method of performing wafer testing. The method includes generating a radio frequency (RF) test signal, and applying the RF test signal to a device under test (DUT) in a wafer using a buckling beam probe set with a predefined pitch. The method also includes detecting an output RF signal from the DUT in response to the applying the RF test signal to the DUT, and sensing at least one frequency component of the detected output RF signal.

In another aspect of the invention, there is a system for in-line wafer testing. The system includes a probe interface board (PIB) operatively connected to a buckling beam probe set that is configured to contact a device under test (DUT) in a wafer via a kerf region of the wafer, wherein a predefined pitch of the buckling beam probe set is greater than a minimum pad pitch of a predefined kerf probing pad set. The system also includes: a signal generating system that supplies a radio frequency (RF) test signal to the buckling beam probe set; a signal detecting system that receives an output RF signal from the DUT based on the RF test signal being applied to the DUT; and a processing system that processes data from the signal detecting system and provides control signals to the signal generating system.

In yet another aspect of the invention, there is a system for conducting in-line wafer testing. The system includes a probe interface board (PIB) connected to a buckling beam probe set that is structured and arranged to contact a device under test (DUT) in an interstitial region of a wafer. The system also includes a first signal generator that generates a radio frequency (RF) test signal, and a power amplifier that amplifies a power of the RF test signal. The system additionally includes a first triplexer connected between the power amplifier and the PIB, and a second triplexer connected between the PIB and at least one RF detector. The at least one RF detector is structured and arranged to detect at least one frequency component of an output RF signal based on the RF test signal being applied to the DUT.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The present invention relates to integrated circuit devices and, more particularly, to in-line testing of integrated circuit devices at wafer level using wafer probing. In accordance with aspects of the invention a test system and methodology are provided for in-line/kerf RF performance monitoring at high RF power levels. In embodiments, the test system includes a buckling beam probe set with a predefined pitch and probe interface board (PIB), a signal generating, receiving and processing subsystem, and a probing pad connection arrangement utilizing an in-line/kerf probe pad set. Utilization of aspects of the invention with an in-line/kerf probe pad set provides the ability to perform high power RF tests, in addition to conventional in-line/kerf tests using the same system, without resorting to manual probing. In this manner, implementations of the invention provide a wafer production test system and method that facilitate in-line/kerf testing at the RF frequency range (rather than being limited to DC and analog), and at high power (rather than being limited to low power).

Figure 1:
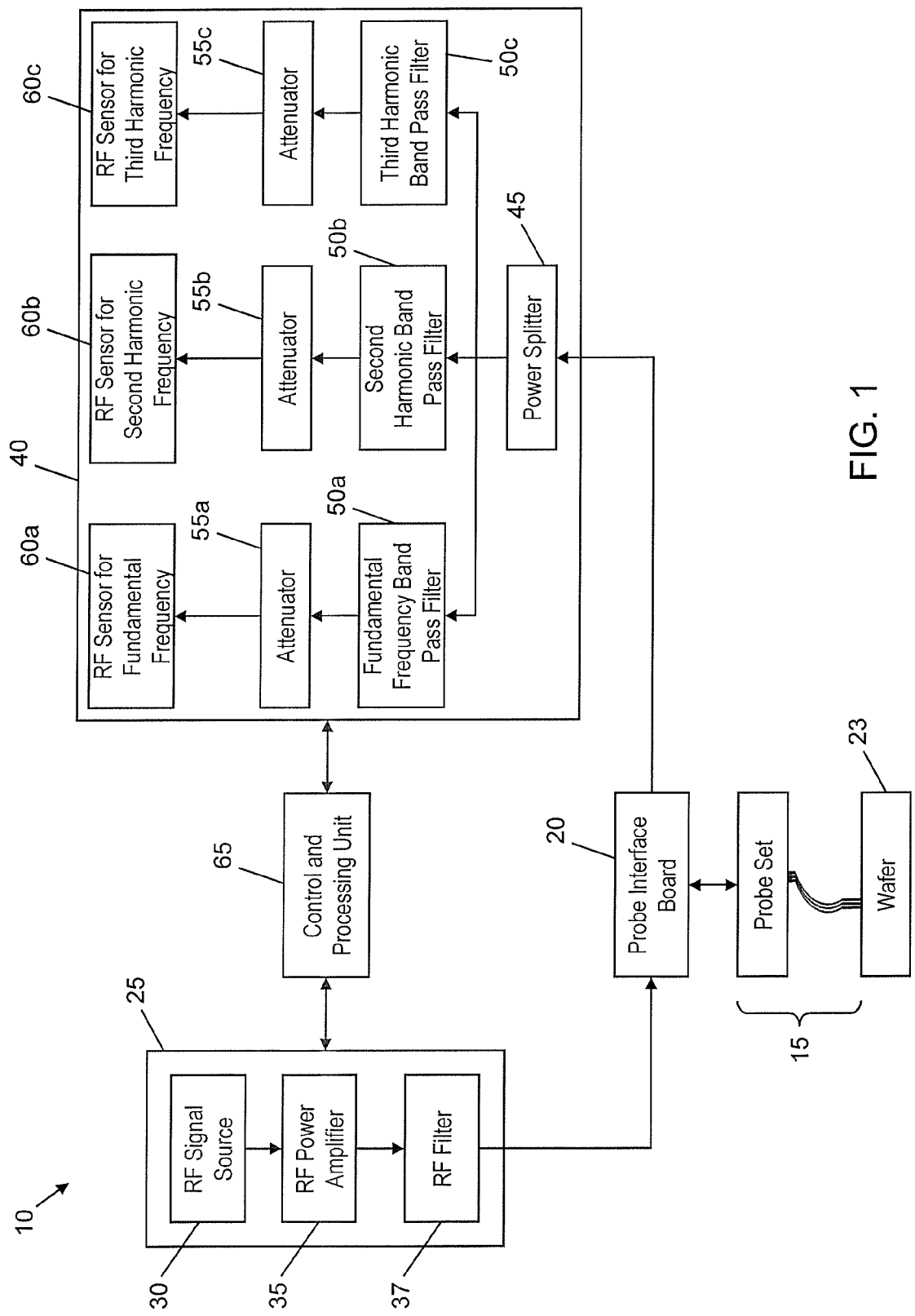
FIGS. 1-4 show block diagrams of wafer testing systems in accordance with aspects of the invention.

FIG. 1 shows a block diagram of an in-line/kerf high power RF test system 10 in accordance with aspects of the invention. In embodiments, the system 10 includes a wafer probe set 15 that provides an in-line/kerf testing interface between a probe interface board (PIB) 20 and a wafer 23. The wafer 23 contains plural integrated circuit chips (e.g., die) separated by kerf lines. Conductive test locations (e.g., metal pads) that are structured and arranged to be physically contacted by individual probes of the probe set 15 are contained within the kerf lines, as is understood by those having ordinary skill in the art.

According to aspects of the invention, the probe set 15 comprises a buckling beam probe set, which is also referred to as a Cobra® probe set (Cobra is a registered trademark of Wentworth Laboratories, Inc. of Brookfield, Conn.). The probe set 15 comprising the buckling beam probe set includes a robust, low cost production probe card that can be used with DC and analog tests, which is also usable up to 6

GHz with ground-signal-ground (GSG) RF signal pad arrangement, and which has a higher power rating than cantilever-type probe sets.

Still referring to FIG. 1, the system 10 includes a power source 25 that is connected to and supplies electrical power to the PIB 20. In embodiments, the power source 25 includes an RF signal source 30, an RF power amplifier 35, and an RF filter 37. The RF signal source 30 generates an RF signal, such as about 0.1 watts (W). The RF power amplifier 35 boosts (e.g., amplifies) the signal from the RF signal source 30, e.g., to about 1-3 W. The RF filter 37 filters the amplified signal from the RF power amplifier 35 to provide a desired clean frequency signal to the PIB 20. It is noted that the invention is not limited to the signal amplitudes described herein, and any suitable high-power RF signals may be used within the scope of the invention.

In operation, the PIB 20 receives the RF signal from the power source 25 and applies the RF signal as an input signal (e.g., RFin) to a test location on the wafer 23 via one or multiple of the probes in the probe set 15. An output signal (e.g., RFout) resulting from the applied input signal is communicated from another test location on the wafer 23 to the PIB 20 via another one or multiple of the probes in the probe set 15. More than one input signal and/or more than one output signal may be utilized at any given time during testing of the wafer 23. Other probes of the probe set 15 not carrying an input signal or output signal may be connected to other test locations on the wafer 23 for supplying control signals, bias voltages, grounding, etc.

With continued reference to FIG. 1, a detection subsystem 40 is connected to the PIB 20 and receives output signals (e.g., RFout) from the PIB 20. In accordance with aspects of the invention, the detection subsystem 40 comprises a power splitter 45 and a set of band pass filters (or low, band and high pass filter combinations) 50a-c that isolate desired components of the output signal. In embodiments, the power splitter 45 is a three-way power splitter and the filters include a fundamental frequency band pass (or low pass) filter 50a, a second harmonic band pass filter 50b, and a third harmonic band pass filter 50c, although any number and/or types of filters may be used within the scope of the invention. The fundamental frequency band pass filter 50a is optional. Connected to each respective one of the filters 50a-c is an attenuator 55a-c and an RF sensor 60a-c matched to the frequency of its associated filter. For example, RF sensor 60a is configured to detect the fundamental frequency corresponding to filter 50a. Similarly, RF sensor 60b is configured to detect the second harmonic frequency corresponding to filter 50b, and RF sensor 60c is configured to detect the third harmonic frequency corresponding to filter 50c. The attenuators 55a-c are used to condition the amplitude of the signal that is supplied to each of the sensors 60a-c. The attenuators 55a-c may alternatively be connected between the power splitter 45 and the filters 50a-c.

As further depicted in FIG. 1, a control unit 65 is connected to the power source 25 and the detecting subsystem 40. In embodiments, the control unit 65 comprises test system equipment for controlling aspects of the in-line/kerf RF testing, such as: generating the RF signal, applying test signals to the wafer 23, and processing data detected by the sensors 60a-c. The control unit 65 may comprise at least one computing device with appropriate programming for carrying out the control of the in-line/kerf RF testing. The computing device may comprise, for example, one or more processors or processing units, a system memory, and a bus that couples various system components including the system memory to the processor. Programming for carrying out the control of the in-line/kerf RF testing, e.g., as described herein, may be stored in the system memory and executed by the processor in order to cause the computing device to perform one or more of the functions described herein.

Figure 2:
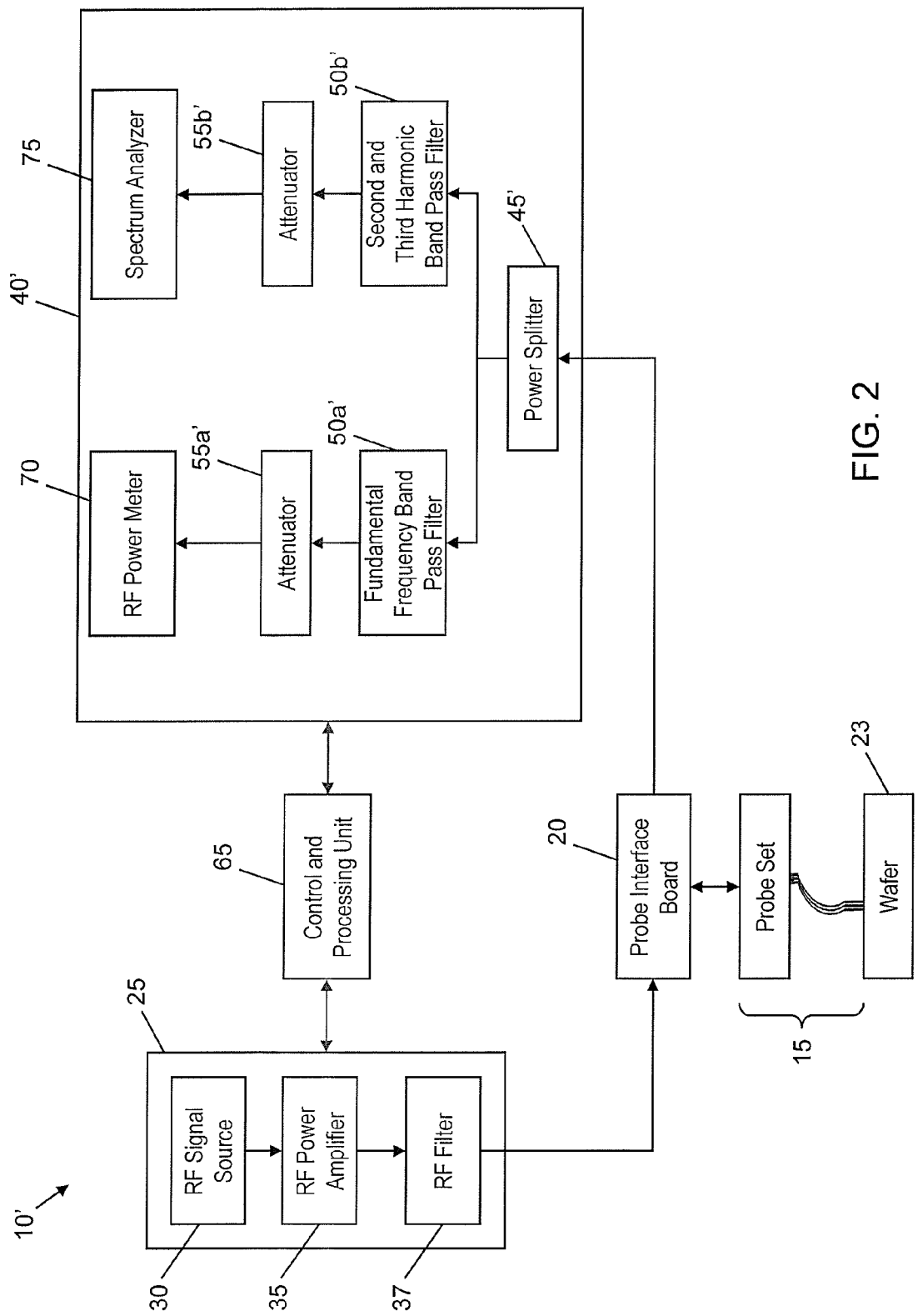

FIG. 2 shows a block diagram of another in-line/kerf high power RF test system 10' in accordance with aspects of the invention. The system 10' of FIG. 2 includes many of the same elements as the system 10 of FIG. 1, including: probe set 15, PIB 20, wafer 23, power source 25 (including RF signal source 30, an RF power amplifier 35, and an RF filter 37), and control unit 65. The system 10' of FIG. 2 differs from the system 10 of FIG. 1 in the implementation of the detecting subsystem 40'.

According to aspects of the invention, the detecting subsystem 40' of the system 10' of FIG. 2 includes a power splitter 45', band pass filters 50a' and 50b', and attenuators 55a' and 55b'. In embodiments, the filter 50a' is a fundamental frequency band pass (or low pass) filter. Attenuator 55a' is connected to the output of the filter 50a', and an RF power meter 70 is connected to the output of the attenuator 55a'. The RF power meter 70 thus detects a fundamental frequency portion of the RF output signal from the wafer 23. The filter 50a' is optional, and the attenuator 55a' and RF power meter 70 may alternatively be connected directly to an output of the power splitter 45'. In embodiments, the filter 50b' is a combined second and third harmonic band pass (or high pass) filter. Attenuator 55b' is connected to the output of the filter 50b', and spectrum analyzer 75 is connected to the output of the attenuator 55b'. The spectrum analyzer 75 may thus be used to detect the second and third harmonic portions of the RF output signal from the wafer 23. The attenuators 55a' and 55b' may alternatively be connected between the power splitter 45' and the filters 50a' and 50b'. Any suitable filters 50a' and 50b' and attenuators 55a' and 55b' may be used, and may be selected, for example, based on the test signal, DUT, and other test equipment.

Figure 3:
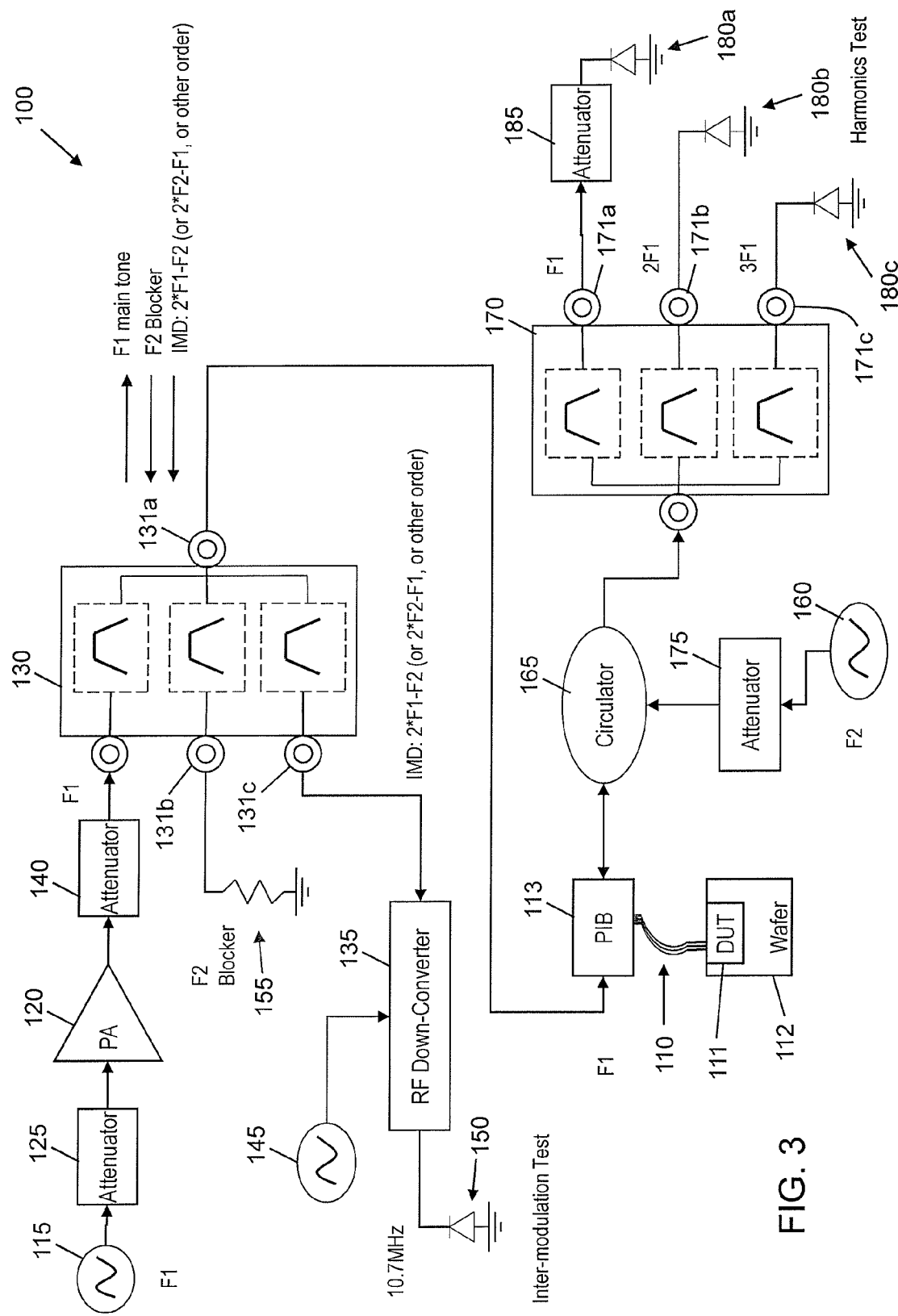

FIG. 3 shows a block diagram of another in-line/kerf high power RF test system 100 in accordance with aspects of the invention. The system 100 is described herein with reference to particular exemplary frequencies and amplitudes; however, it is understood that the invention is not limited to these particular exemplary values, and that the system 100 may be configured to operate with other frequencies and amplitudes within the scope of the invention. The system 100 may be used for harmonics and inter-modulation tests of RF components in a wafer.

According to aspects of the invention, the system 100 includes a probe set 110 with a defined pitch/periodicity that is structured and arranged to selectively contact a device under test (DUT) 111 in an interstitial (kerf) region of a wafer 112. The probe set 110 may be similar to probe set 15 of FIG. 1 and the wafer 112 may be similar to wafer 23 of FIG. 1. In embodiments, the DUT 111 is an RF switch. The system 100 also includes a PIB 113 (which may be similar to the PIB 20 of FIG. 1) connected to the probe set 110.

In embodiments, the system 100 includes a first signal generator 115 that generates and outputs a test RF signal, and an RF power amplifier 120 that boosts the test RF signal power. The first signal generator 115 may be similar to RF signal source 30 of FIG. 1, and may generate the fundamental tone or first tone signal having a frequency of F1. In embodiments, F1 may be in a range of about 800 MHz to about 850 MHZ, and more specifically about 824 MHz, although other values may be used within the scope of the invention. The RF power amplifier 120 may be similar to RF power amplifier 35 of FIG. 1, and may be a 45 dB gain amplifier, as one non-limiting example. The system 100 may include a first attenuator 125 connected between the first signal generator 115 and RF power amplifier 120 to improve matching and compress multiple reflections between these components. The first attenuator 125 may comprise a 3 dB attenuator, as one non-limiting example.

Still referring to FIG. 3, the system 100 includes a first triplexer 130 that passes certain test signals with matched termination for the harmonics and the second tone or blocker signal, at a first port 131a. In embodiments, the first triplexer 130 provides a path for a third order inter-modulation distortion (IMD3) test, which terminates a second tone (frequency of F2), at a second port 131b. The first triplexer 130 may further be configured to pass the IMD3 signal to an RF down-converter 135 at a third port 131c. In embodiments, the first triplexer 130 is a 100 dBc triplexer, as one non-limiting example. A second attenuator 140 (e.g., a second 3 dB attenuator) may be connected between the RF power amplifier 120 and the first triplexer 130 to improve matching and compress multiple reflections between these components.

In embodiments, the RF down-converter 135 is coupled to the third port 131c of the first triplexer 130 and is configured to convert the IMD3 signal down for detection after rigorous IF signal filtering and amplification at 10.7 MHz, although other IF frequency values may be used within the scope of the invention. The system 100 may also include a local oscillator (LO) signal source 145 connected to the RF down-converter 135 for providing an LO signal to the RF down-converter 135. The system 100 may additionally include an IMD3 RF detector 150 that detects the RF signal from the RF down-converter 135 as part of the inter-modulation test. The IMD3 RF detector 150 may operate at a frequency of about 10.7 MHz, although other IF frequency values may be used within the scope of the invention. The invention is not limited to using an RF down-converter and local oscillator, and any suitable detection equipment (e.g., a digitizer, etc.) may be used within the scope of the invention.

The system may further include a blocking element 155 (e.g., a termination) comprising a pull down resistor coupled to the second port 131b of the first triplexer 130. In embodiments, the blocking element 155 is a 50 Ohm pull down resistor for at least the second tone or blocker frequency F2, as one non-limiting example. In embodiments, frequency F2 is in a range of about 750 MHz to about 800 MHz, and more specifically is about 779 MHz, although other values may be used within the scope of the invention.

With continued reference to FIG. 3, the system 100 includes a second signal generator 160 that generates and outputs a second tone RF signal. In embodiments, the second tone RF signal with frequency F2 is used in the inter-modulation test and insertion loss test (S21). A circulator 165 may be connected between the PIB 113, the second signal generator 160, and a second triplexer 170, e.g., for isolation purposes. In embodiments, the circulator 165 selectively connects the PIB 113 and second triplexer 170 for communicating an output test signal from the DUT 111 to the second triplexer 170. The second triplexer 170 separates the fundamental frequency from the second and third harmonics. The circulator 165 also selectively connects the second signal generator 160 to the PIB 113 for communicating the second tone RF signal to the first triplexer 130 for the inter-modulation test. A third attenuator 175 (e.g., a third 3 dB attenuator) may be connected between the second signal generator 160 and the circulator 165 to improve matching and compress multiple reflections between these components.

According to aspects of the invention, an RF input test signal (e.g., RFin) that is generated by signal generator 115 is communicated to the DUT 111 through the power amplifier 120, first triplexer 130, PIB 113, probe set 110, and any additional signal conditioning elements such as attenuators 125 and 140. In embodiments, the RF input test signal is applied to the DUT 111 in an in-line/kerf test of the wafer 112. An RF output test signal (e.g., RFout) of the in-line/kerf test is generated at the DUT 111 and received by the second triplexer 170, which has high frequency selectivity for outputting portions of the RF test signal at different ports 171a-c. In embodiments, the second triplexer 170 passes a fundamental frequency portion of the RF test signal through a first port 171a to a first RF detector 180a. Moreover, the second triplexer 170 passes a second harmonic frequency portion of the RF test signal through a second port 171b to a second RF detector 180b. Further, the second triplexer 170 passes a third harmonic frequency portion of the RF test signal through a third port 171c to a third RF detector 180c. The RF detectors 180a-c may be similar to RF sensors 60a-c described with respect to FIG. 1.

The system 100 may further include an attenuator 185 connected between the first port 171a and the first RF detector 180a to attenuate the signal to an amplitude that is usable by the first RF detector 180a. For example, the attenuator 185 may be a 30 dB attenuator, as one non-limiting example. The second triplexer 170 may be, for example, a 100 dBc triplexer.

The second triplexer 170 performs a similar function as the power splitter 45 and filters 50a-c of system 10 of FIG. 1. In embodiments, the second triplexer 170 of system 100 can be replaced with an appropriate combination of a power splitter 45 and filters 50a-c as arranged in FIG. 1. Similarly, an RF power meter and spectrum analyzer (e.g., RF power meter 70 and spectrum analyzer 75 as depicted in FIG. 2) may be substituted for RF detectors 180a-c in the system 100 of FIG. 3.

As thus described herein, the system 100 implemented according to aspects of the invention may be used to perform a high power in-line/kerf test of harmonics of an RF switch (e.g., DUT 111) in a wafer 112. In a particular exemplary implementation, the system 100 may be utilized to monitor RF switch yield by checking harmonics of the switch at high RF power, e.g., at about 30-35 dBm (about 1-3 W). The switch may comprise, for example, single pole nine throw (SP9T) switch, although other devices may be tested within the scope of the invention. The system 100 may also be used to perform RF inter-modulation tests.

Figure 4:
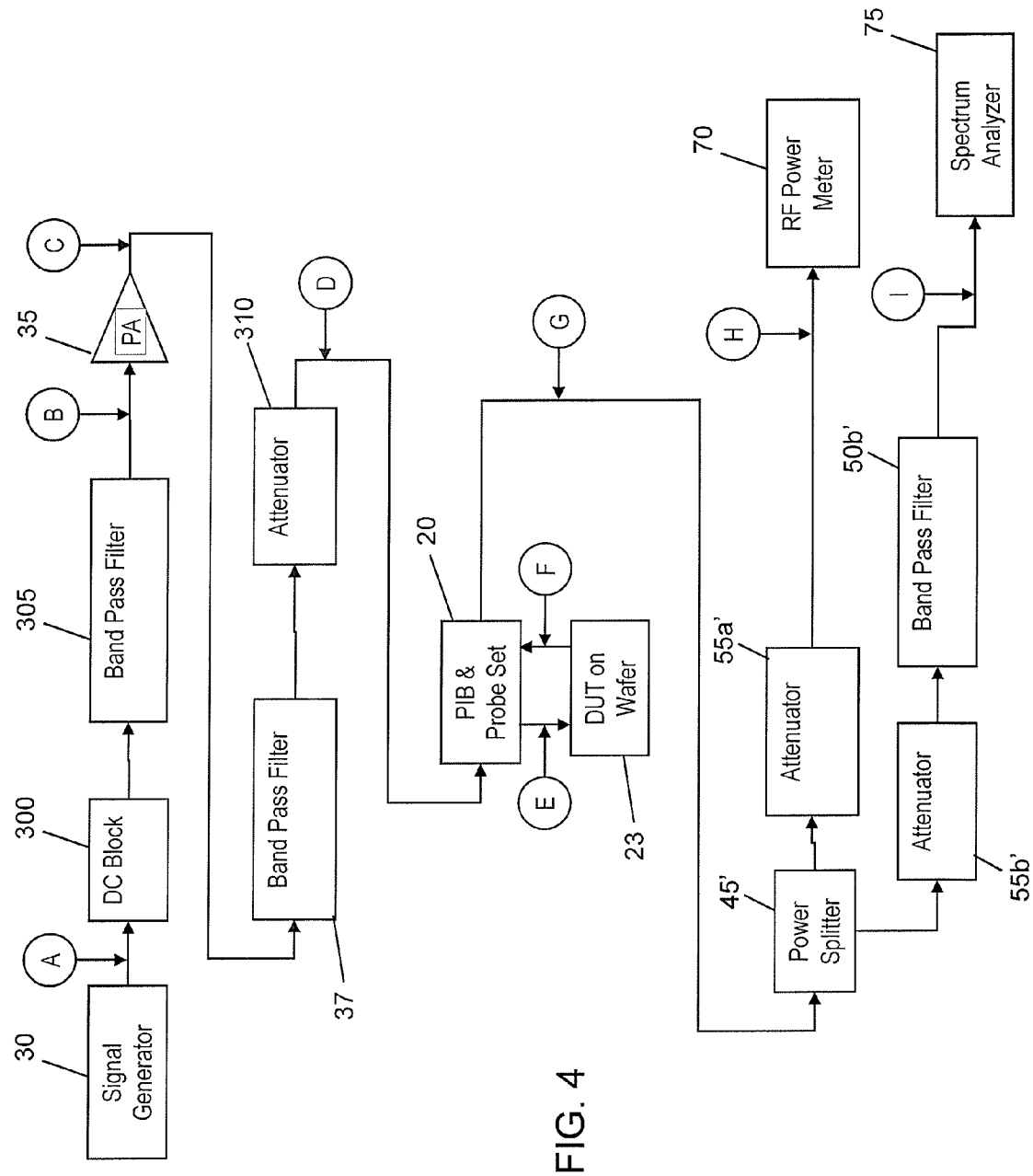

FIG. 4 shows a block diagram of an exemplary implementation of the system 10' of FIG. 2 for performing harmonic tests of a DUT. The system is described herein with reference to particular exemplary frequencies and amplitudes; however, it is understood that the invention is not limited to these particular exemplary values, and that the system may be configured to operate with other frequencies and amplitudes within the scope of the invention. As shown in FIG. 4, an RF signal generator 30 is connected to an RF power amplifier 35. A DC block 300 that blocks DC signals and a band pass filter 305 (e.g., 870.5 MHz) are connected between the RF signal generator 30 and the RF power amplifier 35.

Still referring to FIG. 4, in embodiments, an RF filter 37 (e.g., 870.5 MHz) and an attenuator 310 (e.g., 3 dB) are connected between the RF power amplifier 35 and the PIB 20. The PIB 20 carries the probe set which selectively contacts a DUT on the wafer 23. The PIB 20 is also connected to the power splitter 45'. One output of the power splitter 45' is connected to an attenuator 55a' (e.g., 29 dB), which is connected to an RF power meter 70. Another output of the power splitter 45' is connected to an attenuator 55b' (e.g., 13 dB), a band pass filter 50b' (e.g., 1.7 to 3.8 GHz), and a spectrum analyzer 75. The DUT on the wafer 23 may comprise an RF switch, for example a single pole nine-throw (SP9T) switch, although other devices may be tested within the scope of the invention. The system may be calibrated, for example, by measuring the power level at each node "A" through "I". The calibration may be used to at least one of: determine the path loss or gain from the signal generator to the DUT and from the DUT to the test equipment; and ensure the signal delivered to the DUT has much lower harmonic levels than the DUT.

FIGS. 5-8 show probe connection diagrams in an in-line/kerf probe pad set in accordance with aspects of the invention. The probe set in embodiments of the invention (e.g., probe set 15 and/or probe set 110) may be implemented by providing a Cobra probe in only every other pad of a conventional in-line/kerf probe pad set. For example, a conventional in-line probe pad set may comprise twenty-five pads with a 100 µm pitch (e.g., the distance from the center of one pad to the center of an adjacent pad). The available 100 µm pitch is not suitable for Cobra probes because of the possibility of physical interference (e.g., touching) between probes placed at adjacent pads. The 100 µm pitch is also not suitable for RF signals due to the potential for electrical interference between probes placed at adjacent pads, as well as the probe characterization impedance.

Figure 5:
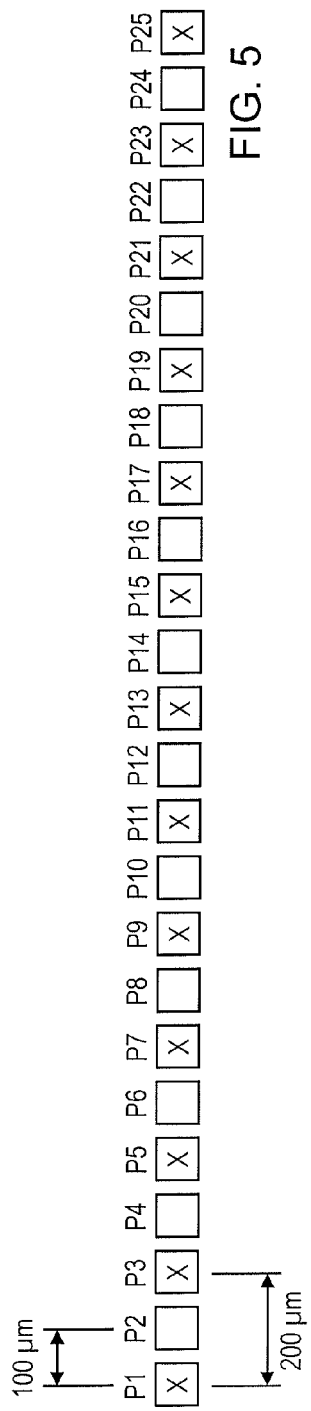
FIGS. 5-8 show wafer probe pad set diagrams in accordance with aspects of the invention.

Implementations of the invention avoid these shortcomings by providing a Cobra probe only at every other pad location in a conventional in-line/kerf probe set (e.g., at a predetermined spacing that is twice that of a kerf pad set spacing (e.g. 100 um)), such that there is an empty pad location between adjacent probes. This is depicted in FIGS. 5-8 which show configurations of a 100 µm pitch probe pad set having twenty-five pads P1-P25 in which a pad containing an "X" indicates a pad with a probe, and a pad without an "X" indicates a pad without a probe. For example, FIG. 5 shows the in-line/kerf probe pad set P1-P25 in which a Cobra probe is provided at each of the odd numbered pads (e.g., P1, P3, . . . , P25), and in which no probe is provided at the even number pads (e.g., P2, P4, . . . , P24). The configuration of FIG. 5 thus utilizes a twenty-five pad, 100 µm pitch in-line/kerf probe pad set (e.g., having an available minimum spacing of 100 µm between probes) to provide a 13-probe, 200 µm pitch Cobra probe set (e.g., with a spacing twice that of the available predefined kerf probing pad spacing).

Figure 6:
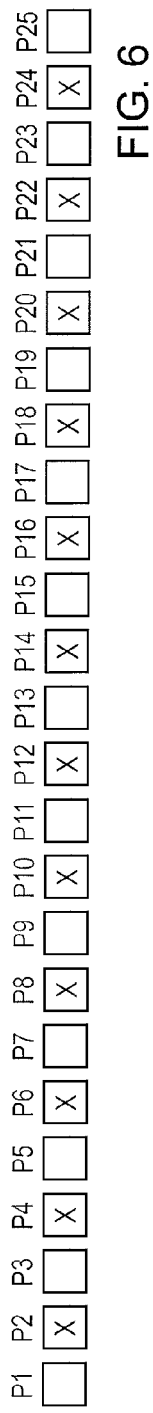

FIG. 6 shows the in-line/kerf probe pad set P1-P25 in which a Cobra probe is provided at each of the even number pads (e.g., P2, P4, . . . , P24), and in which no probe is provided at the odd number pads (e.g., P1, P3, . . . , P25). The configuration of FIG. 6 thus utilizes a twenty-five pad, 100 µm pitch in-line/kerf probe pad set to provide a 12-probe, 200 µm pitch Cobra probe set.

Figure 7:
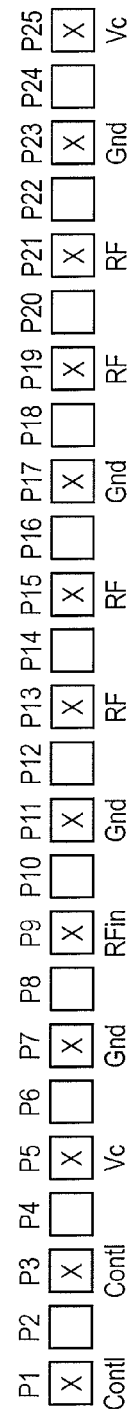
Figure 8:
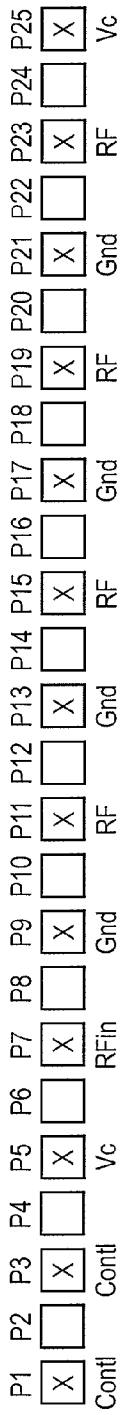

FIGS. 7 and 8 depict two different exemplary signal assignments for the probes in a 13-probe, 200 µm pitch Cobra probe set (e.g., as in FIG. 5) in accordance with aspects of the invention. In FIGS. 7 and 8, the following labels are used: "Conti" designates a probe carrying a control signal; "Vc" designates a probe supplied with a bias voltage; "Gnd" designates a probe that is grounded; "RFin" designates a probe carrying the RF input test signal; and "RF" designates a probe carrying the RF output test signal.

Implementations of the invention thus provide an in-line/kerf high power RF test system including: a Cobra probe set with predefined pitch, such as 200 µm pitch set; a probe interface board (PIB) to provide signal connections and holding to the Cobra probe set; an RF signal source and power boosting/filtering block connected to the PIB; a power splitting, filtering and attenuating block connected to the PIB; a detecting subsystem, such as at least one of RF sensors, a spectrum analyzer, and an RF power meter; and a control unit. In embodiments, a connection arrangement of probes utilizes a conventional in-line probing pad set, such as a 100 µm pitch twenty-five pad set, but uses only every other pad. The probe set may be implemented in this manner and with two grounded probes flanking the RF signal probe (with empty pads there between) to provide a large usable RF bandwidth. In this manner, implementations of the invention may be used to provide RF performance monitoring at lower metal levels (e.g., before the last/top metal layer of a wafer) without incurring the potential damage on the dielectric layer as with manual RF probe sets.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method of performing wafer testing, comprising:
generating a radio frequency (RF) test signal;
applying the RF test signal to a device under test (DUT) in a wafer using a buckling beam probe set with a predefined pitch;
detecting an output RF signal from the DUT in response to the applying the RF test signal to the DUT; and
sensing at least one frequency component of the detected output RF signal,
wherein the generating the RF test signal comprises:
generating an RF signal;
amplifying the RF signal using an RF power amplifier; and
inputting the amplified RF signal to a triplexes connected between the RF power amplifier and a probe interface board (PIB) that is operatively connected to the buckling beam probe set.

2. The method of claim 1, wherein the wafer testing comprises in-line/kerf testing.

3. The method of claim 1, wherein the applying the RF test signal to the DUT comprises contacting the buckling beam probe set to a contact location in a kerf region of the wafer.

4. The method of claim 3, wherein the applying the RF test signal to the DUT is performed in-line during manufacturing of the wafer.

5. The method of claim 1, further comprising arranging the buckling beam probe set in a probe interface board having a predefined pitch twice of that of a predefined kerf probing pad pitch.

6. The method of claim 1, further comprising arranging the buckling beam probe set at only every other pad location of a predefined kerf probing pad set.

7. A system for in-line wafer testing, comprising:
a probe interface board (PIB) operatively connected to a buckling beam probe set that is configured to contact a device under test (DUT) in a wafer via a kerf region of the wafer, wherein a predefined pitch of the buckling beam probe set is greater than a minimum pad pitch of a predefined kerf probing pad set;
a signal generating system that supplies a radio frequency (RF) test signal to the buckling beam probe set;
a signal detecting system that receives an output RF signal from the DUT based on the RF test signal being applied to the DUT; and
a processing system that processes data from the signal detecting system and provides control signals to the signal generating system,
wherein the signal generating system comprises:
an RF signal source;
an RF power amplifier; and
a triplexer connected between the RF power amplifier and the PIB.

8. The system of claim 7, wherein the signal detecting system comprises:
a power splitter;
a fundamental frequency band pass filter connected to a first output of the power splitter; and
a fundamental frequency RF sensor connected to the fundamental frequency band pass filter.

9. The system of claim 8, wherein the signal detecting system further comprises:
a second harmonic frequency band pass filter connected to a second output of the power splitter;
a second harmonic frequency RF sensor connected to the second harmonic frequency band pass filter;
a third harmonic frequency band pass filter connected to a third output of the power splitter; and
a third harmonic frequency RF sensor connected to the third harmonic frequency band pass filter.

10. The system of claim 7, wherein the signal detecting system comprises:
a power splitter;
a fundamental frequency band pass filter connected to a first output of the power splitter;
an RF power meter connected to the fundamental frequency band pass filter;
a second and third harmonic frequency band pass filter connected to a second output of the power splitter; and
a spectrum analyzer connected to the second and third harmonic frequency band pass filter.

11. The system of claim 7, wherein the signal detecting system comprises:
a triplexer that passes a fundamental frequency of the output RF signal through a first port, a second harmonic frequency of the output RF signal through a second port, and a third harmonic frequency of the output RF signal through a third port;
a first RF detector connected to the first port of the triplexer;
a second RF detector connected to the second port of the triplexer; and
a third RF detector connected to the third port of the triplexer.

12. A system for conducting in-line wafer testing, comprising:
a probe interface board (PIB) connected to a buckling beam probe set that is structured and arranged to contact a device under test (DUT) in an interstitial region of a wafer;
a first signal generator that generates a radio frequency (RF) test signal;
a power amplifier that amplifies a power of the RF test signal;
a first triplexer connected between the power amplifier and the PIB; and
a second triplexer connected between the PIB and at least one RF detector, wherein the at least one RF detector is structured and arranged to detect at least one frequency component of an output RF signal based on the RF test signal being applied to the DUT.

13. The system of claim 12, wherein:
the first triplexer comprises a first port tuned for a main input signal, a second port tuned to terminate a blocker signal, and a third port tuned to pass an inter-modulation distortion test signal to be measured;
the second triplexer comprises a first port tuned to a fundamental frequency of the RF test signal, a second port tuned to a second harmonic frequency of the RF test signal, and a third port tuned to a third harmonic frequency of the RF test signal; and
the at least one RF detector comprises a first RF detector connected to the first port, a second RF detector connected to the second port, and a third RF detector connected to the third port.

14. The system of claim 12, further comprising a circulator connected between the PIB and the second triplexer.

15. The system of claim 14, further comprising a second RF signal generator connected to the circulator and that generates a second-tone RF signal for an inter-modulation distortion test or an insertion loss test.

16. The system of claim 15, further comprising an RF down-converter with filtering and amplification connected to a port of the first triplexer.

17. The system of claim 16, further comprising:
a local oscillator signal source connected to the RF down-converter; and
an inter-modulation distortion text RF detector connected to the RF down-converter.

18. The system of claim 16, further comprising a blocking element connected to another port of the first triplexer.

* * * * *